US012237016B2

(12) United States Patent
Guo

(10) Patent No.: US 12,237,016 B2
(45) Date of Patent: Feb. 25, 2025

(54) MEMORY DEVICE, METHOD FOR OPERATING MEMORY DEVICE, MEMORY SYSTEM

(71) Applicant: YANGTZE MEMORY TECHNOLOGIES CO., LTD., Wuhan (CN)

(72) Inventor: Xiaojiang Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 175 days.

(21) Appl. No.: 18/090,409

(22) Filed: Dec. 28, 2022

(65) Prior Publication Data

US 2023/0148416 A1 May 11, 2023

Related U.S. Application Data

(63) Continuation of application No. PCT/CN2021/115475, filed on Aug. 30, 2021.

(51) Int. Cl.
*G11C 16/10* (2006.01)
*G11C 16/08* (2006.01)
*G11C 16/34* (2006.01)

(52) U.S. Cl.
CPC ............ *G11C 16/102* (2013.01); *G11C 16/08* (2013.01); *G11C 16/3459* (2013.01)

(58) Field of Classification Search
CPC ......... G11C 7/109; G11C 5/147; G11C 5/148; G11C 7/1057; G11C 7/1063; G11C 7/12
See application file for complete search history.

(56) References Cited

U.S. PATENT DOCUMENTS

| 2011/0310668 | A1* | 12/2011 | Park ................... G11C 16/0483 365/185.11 |
| 2018/0203774 | A1* | 7/2018 | Srinivasan ......... G11C 16/3459 |
| 2020/0090770 | A1 | 3/2020 | Yang et al. |
| 2021/0264980 | A1 | 8/2021 | Sagron et al. |

(Continued)

FOREIGN PATENT DOCUMENTS

| JP | 2008096591 A | 4/2008 |
| JP | 2012-203692 A | 10/2012 |

(Continued)

OTHER PUBLICATIONS

Supplementary European Search Report issued in corresponding European Application No. 21 95 5369, mailed on Feb. 25, 2024, 11 pages.

(Continued)

*Primary Examiner* — Han Yang
(74) *Attorney, Agent, or Firm* — BAYES PLLC

(57) ABSTRACT

Implementations provide a memory, a method for operating a memory, and a memory system. The discloses method can comprises: applying a multi-plane programming scheme to simultaneously perform programming operations on at least two memory planes of the memory device; and in response to determining that an exceptional memory plane of the at least two memory planes has a programming failure, switching to a single-plane programming scheme to sequentially perform programming operations on the at least two memory planes.

20 Claims, 4 Drawing Sheets

(56) References Cited

U.S. PATENT DOCUMENTS

2021/0264982 A1\* 8/2021 Li .......................... G11C 16/08
2021/0264994 A1   8/2021 Deng et al.
2023/0367680 A1\* 11/2023 Tong .................. G06F 11/2023

FOREIGN PATENT DOCUMENTS

| JP | 2014-175025 A | 9/2014 |
| JP | 2018-045747 A | 3/2018 |
| JP | 2018-055673 A | 4/2018 |
| JP | 2019-526934 A | 9/2019 |
| JP | 2020-047320 A | 3/2020 |
| KR | 20210011251 A | 2/2021 |

OTHER PUBLICATIONS

Notice of Reasons for Refusal issued in corresponding Japanese Application No. 2023-537895, dated Jul. 2, 2024, 8 pages.

\* cited by examiner

MEMORY DEVICE, METHOD FOR OPERATING MEMORY DEVICE, MEMORY SYSTEM

CROSS REFERENCE TO RELATED APPLICATION

This is a continuation of International Application No. PCT/CN2021/115475, filed on Aug. 30, 2021, the entire content of which is incorporated by reference in its entirety.

BACKGROUND

According to structural configuration of a memory-cell array of a memory, the memory can be classified into a single-plane type and a multi-plane type. A memory of the single-plane type includes one memory plane; and a memory of the multi-plane type includes a plurality of memory planes. For the memory of the multi-plane type, a multi-plane programming scheme may be used to perform a programming operation simultaneously on two or more memory planes of the memory, to improve programming efficiency.

Although the adoption of the multi-plane programming scheme can improve the programming efficiency, there is inevitably a problem of adjacent-plane interference. For example, in the case of the multi-plane programming scheme, if a programming failure occurs in one memory plane, programming failures often occur in other multiple memory planes that are simultaneously programmed. Therefore, it is urgent to provide a programming method to reduce the adverse effects of adjacent interference while ensuring the certain programming efficiency.

SUMMARY

Implementations of the present disclosure provide a method for operating a memory, including: performing a programming operation simultaneously on at least two of memory planes of the memory by adopting a multi-plane programming scheme; and in response to determining that a memory plane with a programming exception exists in the at least two memory planes, performing the programming operation sequentially on the at least two memory planes by adopting a single-plane programming scheme.

Implementations of the present disclosure provide a memory, including memory planes and a peripheral circuit coupled to the memory planes; the peripheral circuit is configured to perform a programming operation simultaneously on at least two of memory planes of the memory by adopting a multi-plane programming scheme; and in response to determining that a memory plane with a programming exception exists in the at least two memory planes, perform the programming operation sequentially on the at least two memory planes by adopting a single-plane programming scheme.

Implementations of the present disclosure further provide a memory system, including: one or more memories as described in the aforementioned implementations; and a memory controller coupled to the memories.

BRIEF DESCRIPTION OF THE DRAWINGS

One or more implementations are illustrated by the figures in the accompanying drawings, which do not constitute any limitation of the implementations. Unless otherwise stated, the figures in the drawings do not constitute a scale limitation.

DETAILED DESCRIPTION

Figure 1:
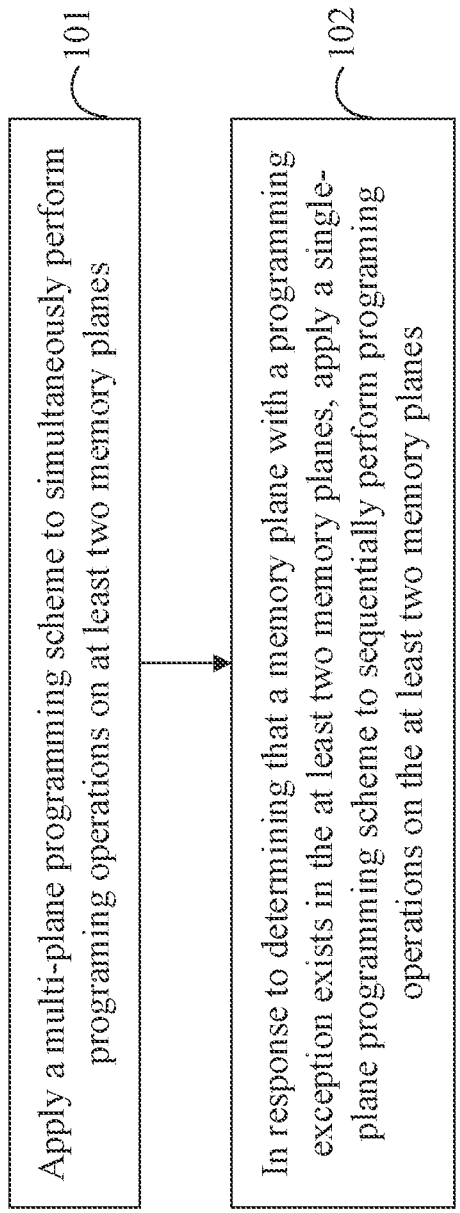
FIG. 1 is a schematic flowchart of a method for operating a memory according to an implementation of the present disclosure.

In order to make the objectives, technical solutions and advantages of the implementations of the present disclosure clearer, the implementations of the present disclosure will be described in detail below with reference to the accompanying drawings. But it can be understood by those skilled in the art that in various implementations of the present disclosure, many technical details are proposed for a better understanding of the present disclosure. However, even without these technical details and various changes and modifications based on the following implementations, the technical solutions claimed herein can be realized.

The memory in the implementations of the present disclosure includes, but is not limited to, a three-dimensional NAND-type memory. For ease of understanding, a three-dimensional NAND-type memory is used as an example for description. However, it should be understood that the implementations of the concept of the present disclosure are not limited to the configuration, but may also be applied to a two-dimensional NAND memory. In addition, without departing from the scope of the present disclosure, the present disclosure can be applicable to other non-volatile memory devices, such as an Electrically Erasable Programmable Read-Only Memory (EEPROM), a NOR type flash memory, a Chase Random Access Memory (PRAM), a Magnetoresistive Random Access Memory (MRAM), a Resistive Random Access Memory (RRAM), a Ferroelectric Random Access Memory (FRAM), and the like.

In practical applications, the three-dimensional NAND-type memory may include a memory-cell array and a peripheral circuit. The memory-cell array may have a plurality of memory planes (Plane), each of the memory planes may include a plurality of memory blocks, and each of the memory blocks may include a plurality of memory pages. The memory page may be a minimum unit for a reading and writing (i.e. programming) operation, and the memory block may be a minimum unit for an erasing operation.

The peripheral circuit may include any suitable digital, analog, and/or mixed-signal circuit configured to facilitate various operations of the memory such as reading operations, writing operations, erasing operations, and the like. For example, the peripheral circuit may include control logic (e.g., a control circuit or a controller), a data buffer, a decoder (also referred to as a decoder), a driver, a reading/writing circuit, and the like. When the control logic receives the reading/writing operation command and the address data, under the action of the control logic, the decoder may apply a corresponding voltage from the driver to a corresponding bit line and word line based on the decoded address, to read/write the data and exchange the data with the outside through the data buffer.

It is noted that, three-dimensional NAND-type memory devices in the memory system can have various defects, some of which can be detected at the time of product delivery, and some of which are exposed with changes in the environment of use after product delivery. In the practical applications, there may be structural weaknesses in some memory-cell arrays of the three-dimensional NAND-type memories. These structural weaknesses may develop and become defects after long time or multiple programming and erasing operations. For example, the memory-cell arrays of the three-dimensional NAND-type memory normally have to withstand high-pressure stress during the programming and erase cycles, and the weak structures in some memory-cell arrays of the three-dimensional NAND-type memory may develop into defects after the cycles.

When a defect occurs in the three-dimensional NAND-type memory, data loss may occur. If the defect is a Word Line (WL) being short-circuited, the data in the memory cells corresponding to the entire WL may be destroyed. Since each WL may correspond to memory cells of multiple strings, a large amount of data may be lost, thereby causing a failure of the memory system. This type of failure is generally defined as a reliability failure of a three-dimensional NAND-type memory, which may further cause the failure of the memory system in the field.

In the case of Programming Status Failed (PSF), the memory system may recover the lost data by using Redundant Arrays of Independent Disk (RAIDs). Generally, the memory system employs a plane-level RAID, and the plane-level RAID can recover only one memory plane from the failure. If the programming fails in a plurality of memory planes, the memory system is not able to recover the data. For such failures, the memory system may perform the RAID at a die (Die) level, but the configuration cost of the memory system will increase.

In the three-dimensional NAND-type memory, an internal voltage bias supply is typically shared between different planes during the programming operation, to save circuit area and power consumption. If one of the memory planes is defective, the other memory planes that share the internal voltage bias supply may not reach the target level. Therefore, even if only one of the memory planes is physically defective, programming failures often occur in a plurality of memory planes, which is the aforementioned Neighbor Plane Disturb (NPD). It is apparent that the neighbor plane disturb has adverse effects, such as data loss as described above. Based on this, if the physical defect exists only in one memory plane, it is desirable that the failure only occurs in the defective memory plane.

An implementation of the present discloses proposes a method for operating a memory (also referred as a memory device). FIG. 1 is a schematic flowchart of a method for operating a memory according to an implementation of the present disclosure. The method includes the following steps.

In step 101, a multi-plane programming scheme is applied to simultaneously perform programming operations on at least two of a plurality of memory planes of the memory.

In step 102, in response to determining that the at least two memory planes include one memory plane with a programming exception, a single-plane programming scheme is applied to sequentially perform programming operations on the at least two memory planes.

The memory may include a plurality of memory planes, and the plurality of memory planes can be programmed simultaneously according to a configuration of the memory. The plurality of memory planes may also be classified into groups, and the plurality of memory planes within each group may be programmed simultaneously.

In the step 101, it may be understood that, in the multi-plane programming scheme, the plurality of memory planes included in the memory may be programmed simultaneously under the control of a controller, and the plurality of memory planes that are programmed simultaneously may share a same row driver. In the practical applications, for the plurality of memory planes that are programmed simultaneously, the same row (e.g., a same word line) may be programmed simultaneously according to the configuration of the row driver; or, different rows (e.g., multiple word lines) may be programmed simultaneously.

In the practical applications, the operation commands in the single-plane programming scheme and the operation commands in the multi-plane programming scheme may be different. In order to increase the programming speed of the memory, the multi-plane programming scheme may be a more common choice of the programming scheme.

In step 102, the programming exception may be understood as a programming failure of one memory plane of the memory planes that are programmed simultaneously due to a memory plane defect or other factors of the one memory plane.

In the practical applications, when simultaneously performing the programming operations on a plurality of memory planes, for each of the memory planes, a word line driving voltage may be simultaneously applied on the word lines in the corresponding memory plane during the programming operation. Herein, the word line driving voltage may include a programming voltage applied on a selected word line and a turn-on voltage applied on an unselected word line. During a programming verification process, a programming verification voltage may be simultaneously applied on the word lines in the corresponding memory plane. When the programming verification for one memory plane fails, the plurality of memory planes that are simultaneously programed may have a programming verification failure.

In the practical applications, the implementations of the present disclosure do not limit the scope of any suitable specific manner of determining that a memory plane with programming exception exists in a plurality of memory planes that are programmed simultaneously.

In some implementations, the determining that the memory plane with the programming exception exists in the at least two memory planes may include the following operations.

A number of programming verifications performed on currently programmed memory cells in the at least two memory planes may be counted.

In response to the number of programming verifications exceeding a preset number corresponding to current data to be written, it may be determined that a memory plane with the programming exception exists in the at least two memory planes.

Herein, the preset number can be understood as a maximum number of programming verifications corresponding to a certain data state (a programmed state).

In the practical applications, a relationship table between the data state and the maximum number of programming verifications may be firstly established according to empirical values. In the table, the maximum number of programming verifications (i.e., the preset number of programming verifications) corresponding to the data state, can be found according to the data state. In the practical applications, the maximum number of programming verifications may be related to the written data and the type of the memory cells (e.g., single-level cell type, or multi-level cell type) for writing the data.

Exemplarily, the memory cells of a trinary-level cell (TLC) type are used as an example for illustration. A trinary-level cell has eight data states, one of which (a zeroth state) is an erasing state, and the remaining seven of which are programming states (first to seventh states) in which the Incremental Step-Pulse Programming (ISPP) programming scheme is adopted. According to the empirical values, it can be determined how many programming pulses are to be applied (i.e., how many programming verifications are to be performed) to reach the first state of programming. For example, in order to reach the first state of programming, 6 programming verifications are to be completed; and in order to reach the second state of programming, 9 programming verifications are to be completed. Generally, more programming verifications are needs for reaching higher data state. That is, the preset number of programming verifications may be related to the number of bits of the data state; and typically, the higher the number of bits of the data state, the greater the preset number of programming verifications corresponding to the data state.

In the practical applications, for any one of the plurality of memory planes that are programmed simultaneously during the programming operation, in some implementations, when programming to one data state is complete, the programming verification of the corresponding data state can be performed on all the memory cells in one memory page in the memory plane. In other implementations, after programming of one memory page is complete, the programming verifications may be performed on the programming state of each of the memory cells in the memory page sequentially from a low state to a high state.

The memory cells of a trinary-level cell (TLC) type are still used as an example for illustration. Regarding the programming verifications performed on each of the memory cells in the memory page, when programming of one data state is complete for all the memory cells in one memory page, the programming verification of the corresponding data state is performed. Specifically, the first state is programmed on all the memory cells, and then all the memory cells are verified whether the first state can be reached within the preset number of programming verifications, for example, 6. If yes, the second state is programmed on the memory cells whose written data exceeds the first state, and then programming verification of the second state is performed. During the period, if a verification failure occurs in a certain data state, that is, a preset number of corresponding programming verifications is exceeded while the corresponding data state is not reached, it may indicate that the memory plane currently programmed is a memory plane with the programming exception.

It should be noted that, in one implementation, when performing the programming verification, it does not mean that the memory plane that is currently programed is determined as the memory plane with the programming exception when the number of programming verifications of any memory cell in one memory page exceeds a preset number but the specified data state is not reached. It can be understood that the memory has a certain error correction capability. For example, an error correction circuit (ECC) can be used to correct a certain number of memory cells with errors. Therefore, for a limited number of programming verification errors (within the error correction capability range), the memory plane that is currently programmed may not be determined as the memory plane with programming exception, but only when the number of verification errors exceeds the error correction capability range, the memory plane that is currently programmed may be determined as the memory plane with programming exception.

In the practical applications, a flag may be set to indicate a multi-plane programming failure, and the flag for indicating the multi-plane programming failure may be stored in a status register of the memory. In one implementation, when the memory checks the flag in the status register to determine that the multi-plane programming failure occurs, the control logic may directly switch to the single-plane programming scheme for programming. In other implementations, when the memory checks the flag in the status register to determine that the multi-plane programming failure occurs, the multi-plane programming state may be paused. At this time, the memory system or host may check the status register when the memory pauses the multi-plane programming state, and then find that the multi-plane programming has an exception. And an instruction may be issued by the memory system or host to instruct the memory to switch to the single-plane programming scheme for programming.

Accordingly, in response to determining that the memory plane with the programming exception exists in the at least two memory planes, performing the programming operation sequentially on the at least two memory planes by adopting the single-plane programming scheme may include:
  in response to determining that the memory plane with the programming exception exists in the at least two memory planes, performing the programming operation sequentially on the at least two memory planes by directly adopting the single-plane programming scheme; or,
  in response to determining that the memory plane with the programming exception exists in the at least two memory planes, pausing the programming operation; and after receiving a second instruction, performing the programming operation sequentially on the at least two memory planes by adopting the single-plane programming scheme.

That is, in the practical applications, when there is an exception in the multi-plane programming scheme, the memory may automatically switch from the multi-plane programming scheme to the single-plane programming scheme. The memory may also switch from the multi-plane programming scheme to the single-plane programming scheme after receiving an instruction for instructing the memory to adopt the single-plane programming scheme issued by the memory controller in the host or the memory system.

In the practical applications, after the single-plane programming scheme is complete, the memory system or the host may detect the programming failure through the status register. In this case, the memory system or the host may take further measures, such as issuing an instruction to dump the stored data in the memory plane with the programming exception.

Based on this, in some implementations, the method may further include the following: in response to determining that the memory plane with the programming exception exists in the at least two memory planes, storing a first flag; and upon reception of a first instruction, storing data allocated to a memory plane in which the programming exception exists into other memory planes in the memory; the first instruction is configured to instruct to dump the stored data in a memory plane corresponding to the first flag.

Herein, the first flag may represent that a memory plane with the programming exception exists in the at least two memory planes. The first instruction may be configured to instruct to dump the stored data in the memory plane corresponding to the first flag. In the practical applications, in the plurality of memory planes that are programmed simultaneously, the memory plane A has a structural defect (such as a leakage current), and the memory plane B has no structural defect. If the memory planes A and B are simultaneously supplied with power by using the same voltage source, the same verification voltage is originally prepared to be applied on the word lines of the memory planes A and B. However, by the cross-plane shared voltage source, the verification voltage actually applied on the word line of the memory plane A may be different from the verification voltage applied on the word line of the memory plane B (the actually applied voltage on the word line of the memory plane A with the leakage current is lower), and even an offset from the target applied voltage may be generated. It will be understood that a target value of a writing threshold voltage Vt is related to the programming voltage, and when the programming voltages applied on the two memory planes are different, the target voltages of the writing thresholds of the two memory planes may be different. In this case, there may be a deviation in the writing data on the memory plane A, and even in the writing data on the memory plane B. That is, even if the memory plane without a structural defect presents a state of passing the multi-plane programming scheme, the distribution of the writing threshold voltage Vt of the memory cell may be turned off due to an incorrect verification condition for the deviation of the cross-plane shared verification voltage. At this time, the potential problem can be mitigated by independent power supply.

In some implementations, the method may further include: applying, by using different voltage sources, programming verification voltages to the currently programmed memory cells in different memory planes respectively.

Herein, in some implementations, the method may further include: applying, by using the different voltage sources, the programming verification voltages to memory cells corresponding to different word lines respectively in a same memory plane.

In the practical applications, during the programming voltage verification, different voltage sources may be used to supply power to selected WLs in different memory planes. Based on the independent supply of the programming verification voltage sources for different memory planes, the WLs of different rows in the same memory planes may be further powered by different voltage sources. It should be noted that the independent power supply herein may refer to presence of a physical quarantine for each of the voltage sources.

It can be understood that, in this way, it may be possible to apply independent programming verification voltages on the different memory planes, thereby ensuring that the programming verification results of the memory planes without structural defects are accurate.

It should be noted that, in step 102, in an implementation, it may be possible to determine only whether at least one memory plane of the plurality of memory planes that are programmed simultaneously exists a problem, without determining which memory plane of the plurality of memory planes that are programmed simultaneously exists the problem.

In the implementations of the present disclosure, when determining that there is a memory plane with the programming exception, the single-plane programming scheme may be configured to perform the programming operation on the plurality of memory planes that are programmed simultaneously. Herein, the single-plane programming scheme may be understood to program only one memory plane contained in the memory at one time. In the single-plane programming scheme, the row driver may apply a word line drive voltage to only one selected memory plane.

In some implementations, the performing the programming operation sequentially on the at least two memory planes by adopting the single-plane programming scheme may include: performing the programming operation on a first memory plane of the at least two memory planes; and in response to determining that the programming operation on a first memory plane is failed or completed, performing the programming operation on a second memory plane of the at least two memory planes.

Herein, both the first memory plane and the second memory plane may be any one of the plurality of memory planes that are simultaneously programmed.

In the practical applications, after switching to the single-plane programming scheme, the at least two memory planes may be sequentially programmed in a random sequence. It is also possible to perform the programming operation on the memory planes sequentially in a specified sequence. For each of the memory planes, the previous programming state may be continued when being programmed.

For example, a memory plane A, a memory plane B, and a memory plane C of the memory may be simultaneously programmed by adopting the multi-plane programming scheme. When detecting that the memory plane with the programming exception exists in the multi-plane programming scheme, it may be assumed that the programming exception is caused by the structural defect of the memory plane A, and the memory planes B and C have no structural defects. When switching to the single-plane programming scheme, the programming operation may be performed on the memory plane A, the memory plane B, and the memory plane C. It may be assumed that the memory plane A may be firstly programmed, and the data for continuing to perform the programming operation may be acquired from a page buffer (PB) of the memory plane A. For example, the memory cell may be of a type of a trinary-level cell (TLC), and the second state of some of the memory cells in the first word line may be being programmed in response to the failure of the multi-plane verification. Then, the programming operation may be continued to be performed on the second state of some of the memory cells in the first word line. Since the memory plane A has the defect, the memory plane A may finally end with a programming failure in a plane level. And when the memory plane A displays the programming failure (at this time, it can be determined that the defective memory plane is the memory plane A), the programming operation may be started to be performed on the memory plane B. The data for continuing the programming operation may be acquired from the PB of the memory plane B. When the programming operation on the memory plane B is completed, the programming operation on the memory plane C may be started again, and the data for continuing the programming operation may be acquired from the PB of the memory plane C until the programming operation of the memory plane C is completed.

It should be noted that, for the defective memory plane A, if all the data to be written in the programming operation are always stored in the PB of the memory plane A, the data failed to be written in the memory plane A may be transferred to the other defective memory planes. If the PB of the memory plane A dynamically stores only the data to be written in the programming operation, the aforementioned RAID can be used to perform data recovery, and the recovered and unwritten data in the memory plane A can be transferred to other non-defective memory planes.

In the practical applications, a plurality of memory planes that are simultaneously programmed by adopting the multi-plane programming scheme may be provided with word line drive voltages by using the same row driver. However, when there is a defective memory plane among the plurality of memory planes that are simultaneously programmed, such as a memory plane having a leakage current, a voltage generated by a power source may be higher than a voltage actually applied on the word line on the memory plane. After switching to single-plane programming, a leakage current distribution may change, and the voltage generated by the high power source may cause an over-programming problem.

Based on this, in some implementations, the performing the programming operation sequentially on the at least two memory planes by adopting the single-plane programming scheme may include: for each of the at least two memory planes, applying a first programming voltage on a first selected word line on a respective memory plane; wherein the first programming voltage is less than a second programming voltage; the second programming voltage is a programming voltage applied to the first selected word line on the respective memory plane which is determined to have the programming exception; and the first selected word line is a selected word line on the respective memory plane which is determined to have the programming exception.

In the practical applications, for each of the memory planes, an initial programming voltage Vpgm applied on the selected word line may be set to a low level when continuing to perform the programming operation. That is, when the multi-plane programming fails, the programming voltage applied on the selected word line (i.e., the first word line) may be appropriately lowered. In the practical applications, the amount to be lowered may be determined based on the empirical values. It should be noted that the over-programming problem can be mitigated to some extent when lowering the programming voltage.

In some implementations, the method may further include: in response to applying the first programming voltage on the first selected word line of the respective memory plane, applying a first turn-on voltage on an unselected word line on the respective memory plane; where the first turn-on voltage is less than a second turn-on voltage; and the second turn-on voltage is a turn-on voltage applied on the unselected word line on the respective memory plane which is determined to have the programming exception.

In the practical applications, for each of the memory planes, an initial turn-on voltage Vpass applied on the unselected word line may also be set to a low level when continuing to perform the programming operation.

In some implementations, Vpgm/Vpass of a word line on a memory plane may be determined according to the programming verification voltage of the respective memory plane in the multi-plane programming.

In some implementations, the method may further include: in response to determining that no memory plane with the programming exception exists in the at least two memory planes, continuing to perform the programming operation on the at least two memory plane by adopting the multi-plane programming scheme.

That is, when there is no exception in the multi-plane programming, the multi-plane programming scheme may always be used for programming.

In the solutions proposed in the implementations of the present disclosure, the failure of the multi-plane programming may be handled by pausing the multi-plane programming scheme. And then programming operation may be performed in the single-plane programming scheme. The solutions proposed in the implementations of the present disclosure can deal with the adjacent plane interference fault of the three-dimensional NAND-type memory, and also improve the reliability of the three-dimensional NAND-type memory. In the implementations of the present disclosure, the programming verification of all the memory planes can be made more accurate, even when one memory plane is defective and the voltage bias of the defective memory plane become inaccurate due to the leakage current. The solutions proposed in the implementations of the present disclosure may be used to detect possible defects in a memory-cell array. In the solutions proposed in the implementations of the present disclosure, the internal deviation can be repositioned when switching to the single-plane programming scheme, to avoid the over-programming problem.

Implementations of the present disclosure further provide a memory, including a plurality of memory planes and a peripheral circuit coupled to the memory planes.

The peripheral circuit may be implemented, for example, by a controller, a logic circuit, or the like, which may be correspondingly configured with respective firmware, for example, by executing firmware to perform a programming operation simultaneously on at least two of the plurality of memory planes by adopting a multi-plane programming scheme. In response to determining that a memory plane with a programming exception exists in the at least two memory planes, the programming operation is performed sequentially on the at least two memory planes by adopting a single-plane programming scheme.

Figure 2:
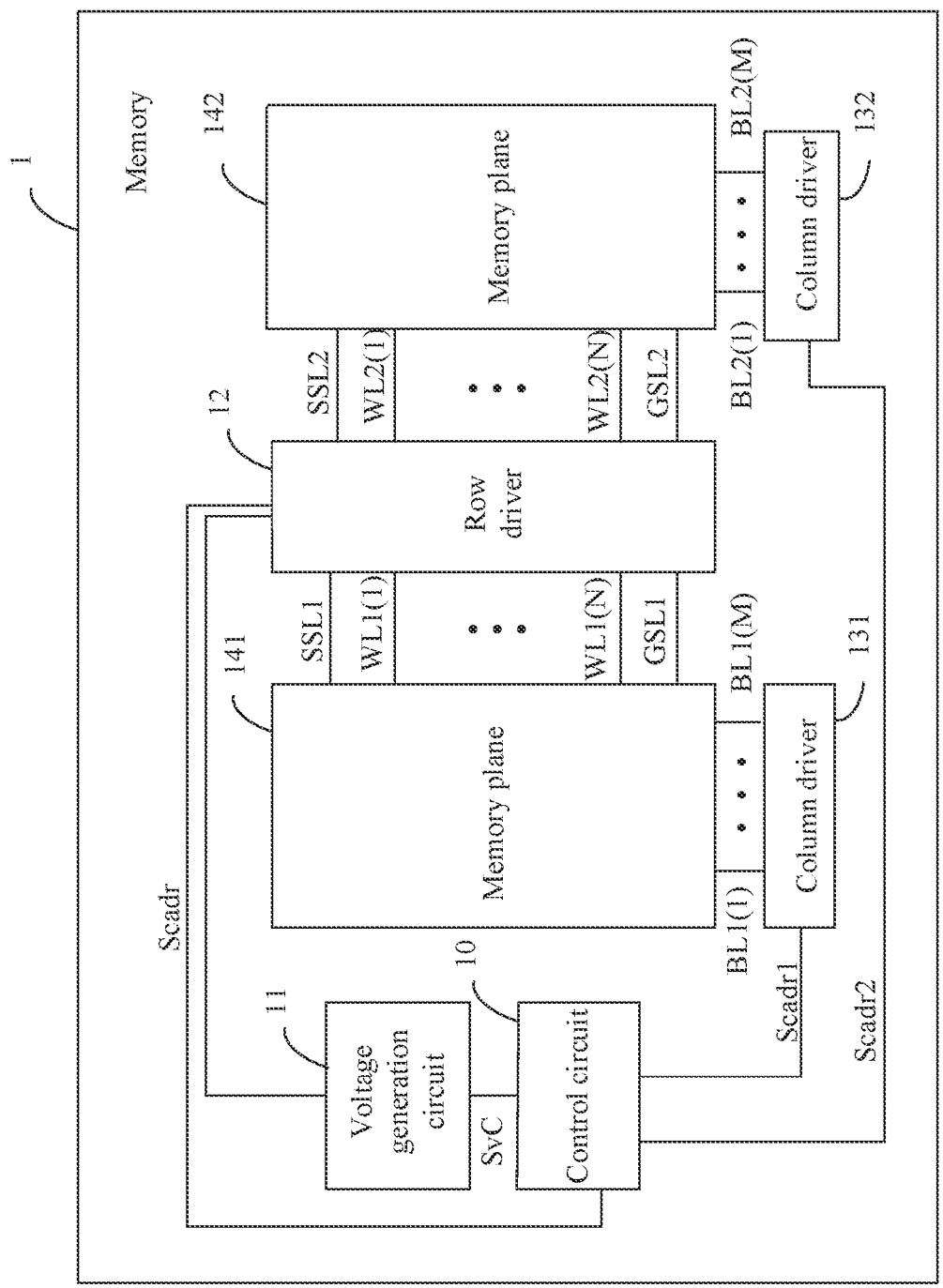
FIG. 2 is a schematic structural diagram of a memory according to an implementation of the present disclosure.

FIG. 2 is a block diagram of a memory 1 according to an implementation of the present disclosure. The memory 1 has a dual memory-plane structure and may include a peripheral circuit. The peripheral circuit may include a control circuit 10, a voltage generation circuit 11, a row driver 12, column drivers 131 and 132. The memory planes may include memory planes 141 and 142. Although the dual memory-plane structure is used in the implementations, it should be understood that other numbers of memory planes may also be used within the scope of the present disclosure. When adopting the multi-plane programming scheme, the memory planes 141 and 142 can be programmed simultaneously.

In the practical applications, the control circuit 10 may be coupled to the voltage generation circuit 11, the row driver 12, and the column drivers 131 and 132. The voltage generation circuit 11 may be coupled to the row driver 12. The row driver 12 may be coupled to the memory plane 141 through a string selection line SSL1, word lines WL1(1) to WL1(N), and a ground selection line GSL1, where N is a positive integer, e.g., N=128. The row driver 12 may be coupled to the memory plane 142 through a string selection line SSL2, word lines WL2(1) to WL2(N), and a ground selection line GSL2. The column driver 131 may be coupled to the memory plane 141 through bit lines BL1(1) to BL1(M), where M is a positive integer, e.g., M=131072. The column driver 132 may be coupled to the memory plane 142 through bit lines BL2(1) to BL2(M). Each of the memory planes 141 and 142 may include a plurality of memory blocks, each of the memory blocks may include a plurality of memory pages, and each memory page may include a plurality of memory cells. The memory cells in the memory plane 141 may be addressed by word lines WL1(1) to WL1(N) and bit lines BL1(1) to BL1(M), and the memory cells in the memory plane 142 may be addressed by word lines WL2(1) to WL2(N) and bit lines BL2(1) to BL2(M).

The control circuit may communicate with a host or a memory controller to receive data for storing the data in the memory planes 141 and 142, and also for transmitting the data acquired from the memory planes 141 and 142. The control circuit may receive commands, addresses, or data from the host or memory controller, and may generate column address signals Scadr1, Scadr2, a row address signal Sradr, and a voltage control signal Svc. In response to the voltage control signal Svc from the control circuit, the voltage generation circuit may generate a voltage for the reading operation, the programming operation, the erasing operation, and the verifying operation. The voltage generated by the voltage generation circuit 11 may exceed the power supply voltage supplied to the memory 1. The row driver 12 may operate in response to the row address signal Sradr from the control circuit 10 to select word lines for the reading operation, the programming operation, the erasing operation, and the verifying operation. The column drivers 131 and 132 may operate in response to the column address signals Scadr1 and Scadr2 from the control circuit 10, to generate bit line signals to select bit lines for the reading operation, the programming operation, the erasing operation, and the verifying operation.

During the programming operation, the voltage generation circuit 11 may use a power supply voltage (e.g., 3.3 V), a programming voltage (e.g., 20 V) and a programming pass voltage (e.g., 10 V). The row driver 12 may apply a programming pulse with an amplitude of the programming voltage on the selected word line; apply the programming pass voltage on the unselected word line; apply the power supply voltage on the string selection lines SSL1 and SSL2; and apply a ground voltage to the ground selection lines GSL1 and GSL2. And the column drivers 131 and 132 may apply the ground voltage (e.g., 0 V) to the selected bit line, and apply the power supply voltage to the unselected bit line. During the verifying operation, the voltage generation circuit may generate an appropriate verification voltage; the row driver may apply an appropriate verification voltage to the selected word line, apply the power supply voltage to the string selection lines SSL1 and SSL2; and apply the power supply voltage to the ground selection lines GSL1 and GSL2. And the column drivers 131 and 132 may apply the ground voltage to the unselected bit lines, and apply the power supply voltage to the selected bit lines of the memory planes 141 and 142 respectively, to read the data from the selected memory cells on the selected bit lines. If the data reading is incorrect, the control circuit 10 may verify the selected memory cell as being failed; and if the data reading is correct, the control circuit 10 may verify the selected memory cell as being passed.

The memory cell may be of a single-level cell (SLC) type, a multi-level cell (MLC) type, a tertiary-level cell (TLC) type, a quad-level cell (QLC) type, a penta-level cell (PLC) type or a higher-level type. Each memory cell may maintain one of Q possible data states, where Q is a positive integer equal to or greater than two. For example, for the SLC, Q=2; for the MLC, Q=4; for the TLC, Q=8; for the QLC, Q=16; and for the PLC, Q=32. The Q possible data states may include an erasing state S(0) and programming states S(1) to S(Q−1), where the programming state S(1) is the lowest programming state and the programming state S(Q−1) is the highest programming state. In one example, the TLC may be programmed to one of eight possible data states, where the programming state S(1) is the lowest programming state, and the programming state S(7) is the highest programming state.

The memory cell may be initially set to the erasing state S(0); and later, a series of programming verification operations may be performed on the memory cell, to program the memory cell to a corresponding target programming state. The series of programming verification operations may begin with the lowest programming state S(1) and then proceed to the higher programming state, until the threshold voltage of the selected memory cell reaches the corresponding verification voltage level of the corresponding target programming state. In some implementations, the verification voltage may be selected as the minimum threshold voltage of the threshold voltage distribution curves of the programming states S(1) to S(Q−1) respectively. Each programming verification operation may include a programming operation and a subsequent verifying operation.

During the programming operation, some of the memory cells may be selected and programmed into the programming state in a row-by-row manner from the first row to the $N^{th}$ row, or from the $N^{th}$ row to the first row.

In some implementations, the peripheral circuit includes a control circuit and a row driver; and the row driver is coupled to the at least two memory planes and controlled by the control circuit.

The row driver may be configured to apply, in the multi-plane programming scheme, a word line drive voltage to the at least two memory planes on which the programming operation is simultaneously performed.

The row driver may be further configured to apply, in the single-plane programming scheme, the word line drive voltage to a selected memory plane.

The row driver herein may be understood with reference to the row driver in FIG. 2, except that in the present implementation, the row driver is coupled to a plurality of memory planes, but in the single-plane scheme, the row driver applies a word line drive voltage to only one of the selected memory planes. Herein, the word line drive voltage may include a programming voltage applied on the selected word line and a turn-on voltage applied on the unselected word line, or a programming pass voltage.

In some implementations, the row driver may be configured to, for each of the at least two memory planes, apply a first programming voltage on a first selected word line on a respective memory plane, after switching from the multi-plane programming scheme to the single-plane programming scheme.

The first programming voltage is less than a second programming voltage; wherein the second programming voltage is a programming voltage applied to the first selected word line on the respective memory plane which is determined to have the programming exception; and the first selected word line is a selected word line on the respective memory plane which is determined to have the programming exception.

In some implementations, the row driver may be further configured to, in response to applying the first programming voltage on the first selected word line of the respective memory plane, apply a first turn-on voltage on an unselected word line on the respective memory plane; where the first turn-on voltage is less than a second turn-on voltage; and the second turn-on voltage is a turn-on voltage applied to the unselected word line on the respective memory plane which is determined to have the programming exception.

In the practical applications, the control circuit may control the voltage generation circuit to output an initial programming voltage/initial turn-on voltage (Vpgm/Vpass) of a lower level, and then control the row driver to apply the Vpgm to only the selected word line of one selected memory plane, and apply the Vpass to the unselected word line.

In some implementations, the peripheral circuit may be configured to: detect a number of programming verifications that is performed on currently programmed memory cells in the at least two memory planes; and in response to the number of programming verifications exceeding a preset number of times corresponding to current data to be written, determine that the memory plane with the programming exception exists in the at least two memory planes.

In some implementations, the peripheral circuit may further include a plurality of programming verification voltage generators; and each of the plurality of programming verification voltage generators may be coupled to one of the at least two memory planes respectively and controlled by the control circuit.

The plurality of programming verification voltage generators may be configured to apply programming verification voltages to the currently programmed memory cells in different memory planes respectively.

In some implementations, each of the plurality of programming verification voltage generators may be coupled to a word line in one of the at least two memory planes respectively.

The plurality of programming verification voltage generators may be configured to apply the programming verification voltages to memory cells corresponding to different word lines respectively in a same memory plane.

Herein, the plurality of programming verification voltage generators may belong to the sub-circuit of the voltage generation circuit in FIG. 2. It should be noted that the plurality of programming verification voltage generators can still be physically isolated from each other when applying to the word lines of the different memory planes through the row drivers.

In some implementations, the peripheral circuit may further include a register configured to store a first flag in response to determining that the memory plane with the programming exception exists in the at least two memory planes.

The peripheral circuit may be configured to, upon reception of a first instruction, store data allocated to a memory plane in which the programming exception exists into other memory planes in the memory. The first instruction may be configured to instruct to dump the stored data in a memory plane corresponding to the first flag.

Herein, the register may be a status register.

In the practical applications, the control circuit may determine whether to switch the programming scheme; and after the single-plane programming scheme ends, the memory system or the host may detect the programming failure through the status register. In this case, the memory system or the host may take further measures, such as issuing an instruction to dump the stored data in the memory plane with the programming exception.

It should be noted that when the memory views the flag for indicating the multi-plane programming failure in the status register, the memory may pause the multi-plane programming state. At the time, the memory system or host may view the status register when the memory pauses the multi-plane programming state, and then find that the multi-plane programming has an exception. And an instruction may be issued by the memory system or host to instruct the memory to switch to the single-plane programming scheme for programming.

In some implementations, the memory includes a three-dimensional NAND-type memory.

The following describes the disclosure in further detail with reference to the application implementations.

Figure 3:
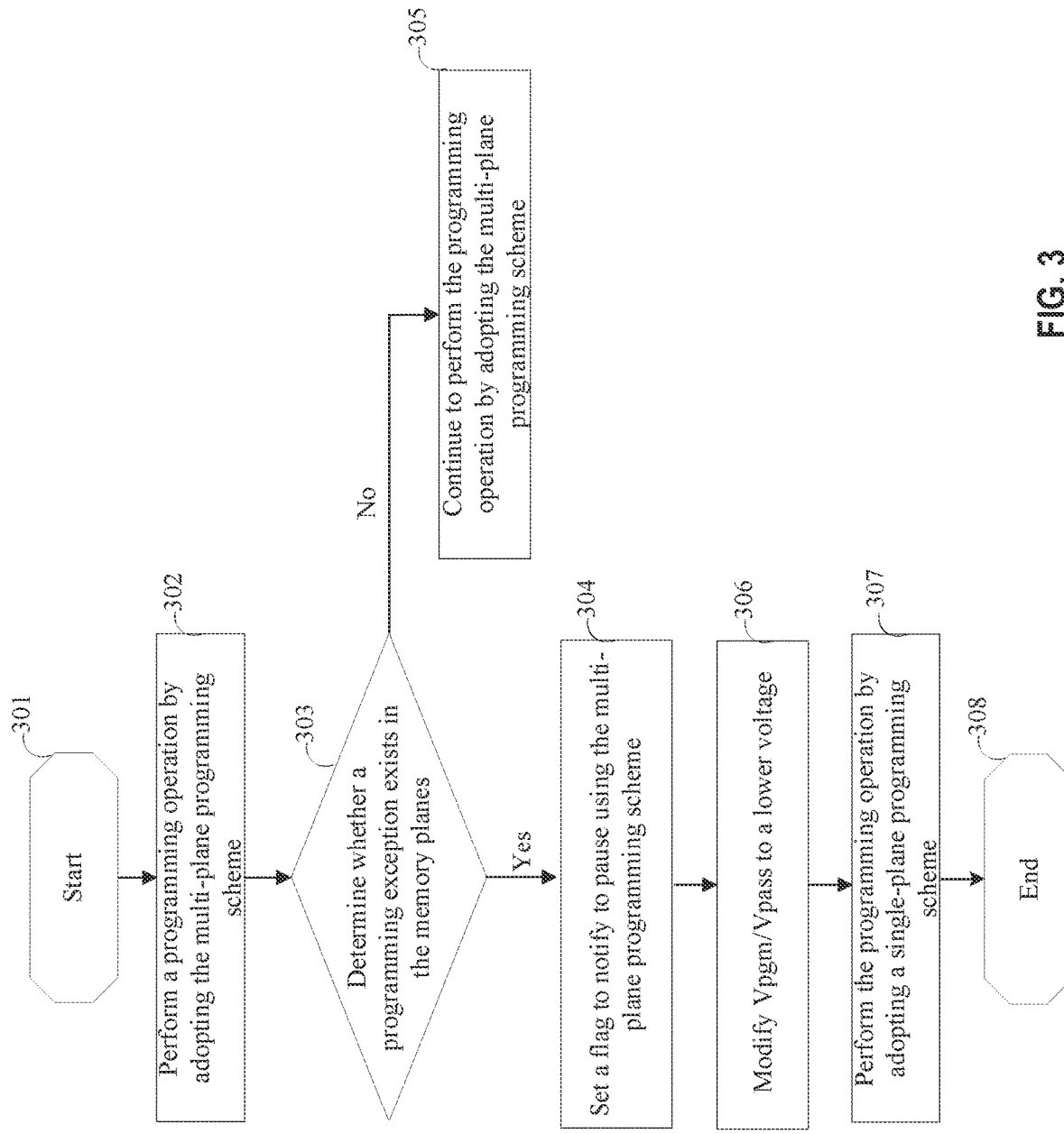
FIG. 3 is another schematic flowchart of a method for operating a memory according to an implementation of the present disclosure.
Figure 4:
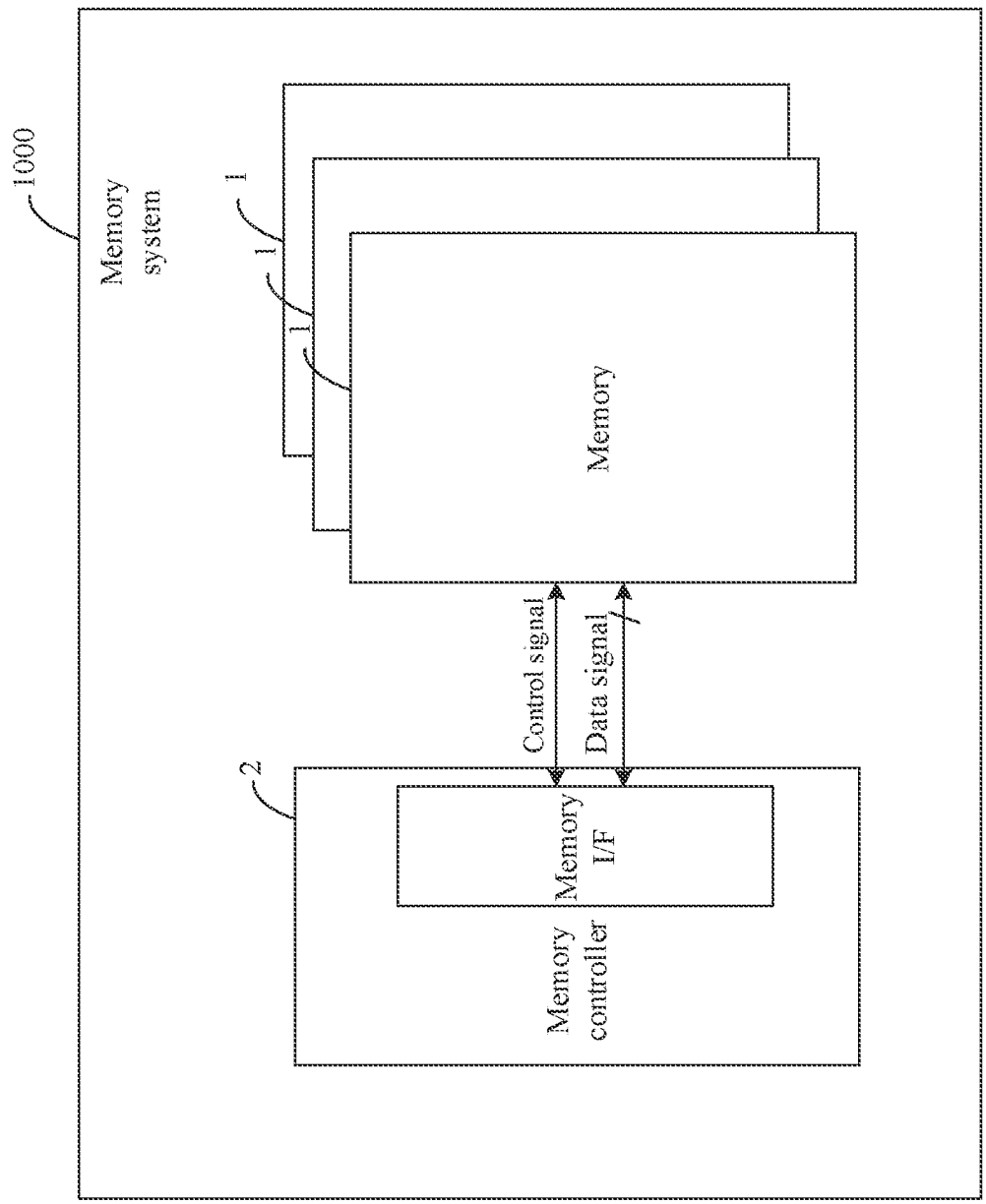
FIG. 4 is a schematic structural diagram of a memory system according to an implementation of the present disclosure.

Application implementations of the present disclosure provide a method for operating a memory. FIG. 3 is a schematic flowchart for implementing the method for operating the memory according to the implementation of the present disclosure. As shown in FIG. 3, the method comprises the following steps of 301 to 308.

In step 301, the process begins.

At the beginning stage, the memory performs preparation tasks such as initialization or the like.

When the control circuit receives an instruction from the host or the memory controller to perform the multi-plane programming operation, the process proceeds to step 302.

In step 302, a programming operation is performed by adopting the multi-plane programming scheme.

Herein, the peripheral circuit may simultaneously program a plurality of memory planes in the memory by adopting the multi-plane programming scheme.

In this step, the programming voltage may be shared between the memory planes. If the memory-cell array in any memory plane is defective, the programming voltage may not reach its target. The programming operation may progress very slowly, even lead to a PSF on other memory planes.

After step 302, the process proceeds to step 303.

In step 303, it is determined whether a programming exception exists in the memory planes.

Herein, the control circuit may determine whether a programming exception exists in the memory planes, according to whether the number of programming voltage verifications exceeds a preset number.

In this step, the number of programming verifications for different PV levels may be tracked, and it may be checked whether the number of programming verifications exceeds the preset number. If the number of validations for a certain PV level exceeds the preset number, it may indicate that the programming exception exists in the memory planes. At the time, a structural defect in the growth of a certain memory plane may be one of the causes for the programming exception.

When the determination result indicates that there is the memory plane with the programming exception, the process may proceed to step 304; and when the determination result indicates that there is no memory plane with the programming exception, the process may proceed to step 305.

In step 304, a flag is set to notify to pause using the multi-plane programming scheme.

In this step, a flag may be set to indicate a multi-plane programming failure, and the flag indicating the multi-plane programming failure may be stored in the status register of the memory. After the memory pauses the multi-plane programming operation, the memory may further switch to the single-plane programming operation. When the entire programming operation is complete, the host or the memory system can detect the flag in the status register, and perform subsequent processing accordingly. After step 304, the process proceeds to step 306.

In step 305, it is continued to perform the programming operation by adopting the multi-plane programming scheme.

Herein, the peripheral circuit may continue to perform the programming operation simultaneously on the plurality of memory planes in the memory by adopting the multi-plane programming scheme.

In step 306, the Vpgm/Vpass is modified to a lower voltage.

Herein, the control circuit may control the voltage generation circuit to set the Vpgm/Vpass to a lower level while applying the Vpgm/Vpass to the word line of the memory planes by using the row driver.

In step 307, the programming operation is performed by adopting a single-plane programming scheme.

Herein, the peripheral circuit may sequentially perform the programming operation on the plurality of memory planes by adopting a single-plane programming scheme.

In this step, when performing the programming operation in the single-plane scheme, the programming pass/failure may be generated in the single-plane level.

It should be noted that there may be no strict sequence between step 306 and step 307 in the practical applications, and step 306 may be actually performed when each of the memory planes in step 307 starts the programming operation.

In step 308, the process ends.

Implementations of the present disclosure further provide a memory system 1000, which includes: one or more memories 1 as described in the aforementioned implementations; and a memory controller 2 coupled to the memories 1.

Herein, in some implementations, the peripheral circuit may be configured to receive a third instruction; in response to the third instruction, perform the programming operation simultaneously on at least two of the plurality of memory planes by adopting the multi-plane programming scheme; and in response to determining that the memory plane with the programming exception exists in the at least two memory planes, pause the programming operation and store a first flag.

The memory controller may be configured to issue a second instruction according to the first flag.

The peripheral circuit may be further configured to receive the second instruction; and in response to the second instruction, perform the programming operation sequentially on the at least two memory planes by adopting the single-plane programming scheme.

Herein, the second instruction may be configured to instruct the memory 1 to perform the programming operation in the multi-plane programming scheme; and the second instruction may be configured to instruct the memory 1 to perform the programming operation in the single-plane programming scheme.

In the practical applications, the memory controller 2 may be configured to control the memory 1 to perform the erasing operation, the reading or writing operation, and further to decode, parse or operate instructions issued or received in the memory. The memory controller 2 may be coupled to the memory 1 through a memory InterFace (I/F).

In the practical applications, the first flag may be stored in a status register corresponding to each memory 1. When there is a pausing programming operation on the memory 1, the memory controller 2 may access the status register corresponding to the memory 1; and the memory controller 2 may issue the second instruction to the memory 1 on which programming is paused according to the first flag. After receiving the second instruction, the memory 1 on which programming is paused may be programmed by adopting the single-plane programming scheme.

It should be noted that "first", "second", etc. are used to distinguish similar objects, and not necessarily used to describe a specific sequence or order.

In addition, the technical solutions described in the implementations of the present disclosure may be arbitrarily combined without conflict.

The foregoing description is merely preferred implementations of the present disclosure, and is not intended to limit the scope of protection of the present disclosure.

What is claimed is:

1. A method for operating a memory device, comprising:
    applying a multi-plane programming scheme to simultaneously perform programming operations on at least two memory planes of the memory device; and
    in response to determining that the at least two memory planes include an exceptional memory plane having a programming failure, switching to a single-plane programming scheme to sequentially perform programming operations on the at least two memory planes, comprising:
        applying a first programming voltage on a selected word line on the exceptional memory plane, wherein the first programming voltage is less than a second programming voltage applied to the selected word line of the exception memory plane when it is determined that the exceptional memory plane has the programming failure.

2. The method of claim 1, wherein sequentially performing programming operations on the at least two memory planes further comprises:
    applying a first turn-on voltage on an unselected word line of the exceptional memory plane, when applying the first programming voltage on the selected word line of the exceptional memory plane;
    wherein the first turn-on voltage is less than a second turn-on voltage applied on the unselected word line of the exceptional memory plane when it is determined that the exceptional memory plane has the programming failure.

3. The method of claim 1, wherein determining that the exceptional memory plane has the programming failure comprises:
    counting a number of programming verifications performed on programming memory cells in the at least two memory planes; and
    in response to the number of programming verifications exceeding a preset number corresponding to written data, determining that that the at least two memory planes include the exceptional memory plane having the programming failure.

4. The method of claim 3, further comprising:
    respectively applying, by using different voltage sources, programming verification voltages to the programming memory cells in different memory planes.

5. The method of claim 3, further comprising:
    respectively applying, by using different voltage sources, programming verification voltages to the programming memory cells corresponding to different word lines in a same memory plane.

6. The method of claim 1, further comprising:
    after determining that the exceptional memory plane has the programming failure, storing a flag in a status register to indicate the exceptional memory plane; and
    in response to receiving of a first instruction for dumping stored data in the exceptional memory plane corresponding to the flag, storing data allocated to the exceptional memory plane into other memory planes in the memory device.

7. The method of claim 6, further comprising:
after determining that the exceptional memory plane has the programming failure, pausing the programming operations of the multi-plane programming scheme;
after receiving a second instruction to switch from the multi-plane programming scheme the single plane programming scheme, sequentially performing programming operations on the at least two memory planes.

8. The method of claim 1, wherein sequentially performing programming operations on the at least two memory planes comprises:
performing programming operations on a first memory plane of the at least two memory planes; and
in response to determining that the programming operations on the first memory plane is failed or completed, performing programming operations on a second memory plane of the at least two memory planes.

9. A memory device, comprising:
at least two memory planes; and
a peripheral circuit coupled to the at least two memory planes;
wherein the peripheral circuit is configured to:
apply a multi-plane programming scheme to simultaneously perform programming operations on the at least two memory planes, and
in response to determining that the at least two memory planes include an exceptional memory plane having a programming failure, switch to a single-plane programming scheme to sequentially perform programming operations on the at least two memory planes, comprising:
applying a first programming voltage on a selected word line on the exceptional memory plane, wherein the first programming voltage is less than a second programming voltage applied to the selected word line of the exception memory plane when it is determined that the exceptional memory plane has the programming failure.

10. The memory device of claim 9, wherein the peripheral circuit comprises:
a row driver coupled to the at least two memory planes; and
a control circuit configured to control the row driver to:
apply, in the multi-plane programming scheme, the second programming voltage on selected word lines of the at least two memory planes, and
apply, in the single-plane programming scheme, the first programming voltage lower than the second programming voltage on the selected word line of the exceptional memory plane.

11. The memory device of claim 10, wherein the row driver is configured to:
apply, in the multi-plane programming scheme, a second turn-on voltage on unselected word lines of the at least two memory planes, and
apply, in the single-plane programming scheme, a first turn-on voltage lower than the second turn-on voltage on an unselected word line of the exceptional memory plane.

12. The memory device of claim 11, wherein the peripheral circuit is configured to:
count a number of programming verifications performed on programming memory cells in the at least two memory planes; and
in response to the number of programming verifications exceeding a preset number corresponding to written data, determine that that the at least two memory planes include the exceptional memory plane having the programming failure.

13. The memory device of claim 12, wherein the peripheral circuit further comprises:
a plurality of programming verification voltage generators each coupled to one of the at least two memory planes
wherein the control circuit is further configured to control the plurality of programming verification voltage generators to apply programming verification voltages to programming memory cells in different memory planes respectively.

14. The memory device of claim 13, wherein:
each programming verification voltage generator is coupled to a word line of one of the at least two memory planes; and
the control circuit is further configured to control the plurality of programming verification voltage generators to respectively apply programming verification voltages to the programming memory cells corresponding to different word lines in a same memory plane.

15. The memory device of claim 9, wherein the peripheral circuit further comprises:
a status register configured to store a flag indicating the exceptional memory plane in response to determining that the at least two memory planes includes the exceptional memory plane having the programming failure; and
the peripheral circuit is configured to, in response to receiving of a first instruction for dumping stored data in the exceptional memory plane corresponding to the flag, control another memory plane in the memory device to store data allocated to the exceptional memory plane.

16. The memory device of claim 15, wherein the peripheral circuit is configured to:
after determining that the exceptional memory plane has the programming failure, pause the programming operations of the multi-plane programming scheme;
after receiving a second instruction to switch from the multi-plane programming scheme the single plane programming scheme, sequentially perform programming operations on the at least two memory planes.

17. The memory device of claim 9, wherein the peripheral circuit is further configured to:
perform programming operations on a first memory plane of the at least two memory planes; and
in response to determining that the programming operations on the first memory plane is failed or completed, perform programming operations on a second memory plane of the at least two memory planes.

18. The memory device of claim 9, wherein the memory device comprises a three-dimensional NAND memory device.

19. A memory system, comprising:
one or more memory devices configured to store data, each comprising:
at least two memory planes; and
a peripheral circuit coupled to the at least two memory planes;
wherein the peripheral circuit is configured to:
apply a multi-plane programming scheme to simultaneously perform programming operations on the at least two memory planes, and
in response to determining that the at least two memory planes include an exceptional memory plane having a programming failure, switch to a single-plane programming scheme to sequentially perform programming operations on the at least two memory planes, comprising:
applying a first programming voltage on a selected word line on the exceptional memory plane, wherein the first programming voltage is less than a second programming voltage applied to the selected word line of the exception memory plane when it is determined that the exceptional memory plane has the programming failure; and
a memory controller coupled to one or more memory devices and configured to control the one or more memory devices through the peripheral circuit.

20. The memory system of claim 19, wherein the peripheral circuit further comprises:
a status register configured to store a flag indicating the exceptional memory plane in response to determining that the at least two memory planes includes the exceptional memory plane having the programming failure; and
the peripheral circuit is configured to, in response to receiving of a first instruction for dumping stored data in the exceptional memory plane corresponding to the flag, control another memory plane in the memory device to store data allocated to the exceptional memory plane.

* * * * *